(12) United States Patent
Kim et al.

(10) Patent No.: US 8,638,163 B2
(45) Date of Patent: Jan. 28, 2014

(54) SEMICONDUCTOR DEVICE AND METHOD OF OPERATING THE SEMICONDUCTOR DEVICE

(75) Inventors: Ho-jung Kim, Suwon-si (KR); U-in Chung, Seoul (KR); Jai-kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/550,848

(22) Filed: Jul. 17, 2012

(65) Prior Publication Data
US 2013/0069714 A1    Mar. 21, 2013

(30) Foreign Application Priority Data
Sep. 16, 2011   (KR) .................. 10-2011-0093646

(51) Int. Cl.
*G05F 1/10* (2006.01)
(52) U.S. Cl.
USPC ............ 327/541; 327/542; 327/543; 327/581
(58) Field of Classification Search
USPC ......... 327/541, 538, 540, 542, 543, 546, 581, 327/590, 319, 333; 257/9, 29, E21.09; 977/734
See application file for complete search history.

(56) References Cited

U.S. PATENT DOCUMENTS

| 2010/0127312 | A1 | 5/2010 | Grebel et al. | |
| 2011/0062313 | A1* | 3/2011 | Ludwig | 250/214 A |
| 2012/0146690 | A1* | 6/2012 | Marshall | 327/113 |

FOREIGN PATENT DOCUMENTS

| JP | 2009-111377 A | 5/2009 |
| KR | 10-2010-0111999 A | 10/2010 |
| KR | 10-2011-0018851 A | 2/2011 |

OTHER PUBLICATIONS

Andersson et al., "Resistive Graphene FET Subharmonic Mixers: Noise and Linearity Assessment," Dec. 2012, IEEE Transactions on Microwave Thoery and Techniques, Vo. 60, No. 12, pp. 4035-4042.*
Dragoman et al., "Microwave Field Effect Transistor Based on Graphene," 2010, IEEE, pp. 279-282.*
Dragoman et al., "Microwave switching of graphene field effect transistor at and far from the Dirac point," 2010, American Institute of Physics, Applied Physics Letters 96, 103105, pp. 103105-1 to 103105-3.*
Park et al., "Influence of metal work function on the position of the Dirac point of graphene field-effect-transistors," 2009, American Institute of Physics, Applied Physics Letters 95, 243105, pp. 243105-1 to 243105-3.*

* cited by examiner

*Primary Examiner* — Lincoln Donovan
*Assistant Examiner* — Jung H Kim
(74) *Attorney, Agent, or Firm* — Harness, Dickey & Pierce, P.L.C.

(57) ABSTRACT

A semiconductor device and a method of operating the semiconductor device. The semiconductor device includes a voltage generator configured to generate a test voltage, a graphene transistor configured to receive a gate-source voltage based on the test voltage, and a detector configured to detect whether the gate-source voltage is a Dirac voltage of the graphene transistor, and output a feedback signal applied to the voltage generator indicating whether the gate-source voltage is the Dirac voltage.

26 Claims, 11 Drawing Sheets

SEMICONDUCTOR DEVICE AND METHOD OF OPERATING THE SEMICONDUCTOR DEVICE

CROSS-REFERENCE TO RELATED APPLICATIONS

This application claims the benefit of Korean Patent Application No. 10-2011-0093646, filed on Sep. 16, 2011, in the Korean Intellectual Property Office, the disclosure of which is incorporated herein in its entirety by reference.

BACKGROUND

1. Field

The present disclosure relates to semiconductor devices and methods of operating the semiconductor devices.

2. Description of the Related Art

Graphene is a material that includes carbon atoms formed in a hexagonal lattice in a monolayer. Chemically, graphene is very stable, and has semiconductor characteristics in that a conduction band and a valence band are overlapped only at one point, that is, at a Dirac point. Also, graphene has a charge mobility that is very high.

Thus, there is a demand for semiconductor devices including a graphene transistor and a method of efficiently operating the semiconductor devices including a graphene transistor.

SUMMARY

Provided are semiconductor devices including a graphene transistor and a method of efficiently operating the semiconductor devices including a graphene transistor.

Additional aspects will be set forth in part in the description which follows and, in part, will be apparent from the description, or may be learned by practice of the presented embodiments.

According to an example embodiment, a semiconductor device includes a voltage generator which generates a test voltage, a graphene transistor which receives a gate-source voltage based on the test voltage, and a detector which detects whether the gate-source voltage is a Dirac voltage of the graphene transistor, and output a feedback signal applied to the voltage generator indicating whether the gate-source voltage is the Dirac voltage.

The detector may detect whether the graphene transistor is off, and if the graphene transistor is detected as being off, the detector may detect the gate-source voltage as the Dirac voltage.

The detector may detect whether the graphene transistor is turned off based on at least one of a drain-source voltage and a drain-source current of the graphene transistor.

If the feedback signal indicates that the gate-source voltage is not the Dirac voltage, the voltage generator may modify the test voltage.

The voltage generator may include: a voltage regulating unit which generates the test voltage based on data stored in a storage unit; and a storage regulating unit which regulates the data stored in the storage unit based on the feedback signal.

The voltage regulating unit may include a first variable resistor and a second variable resistor, and is configured to generate the test voltage based on a ratio of a first resistance of the first variable resistor and a second resistance of the second variable resistor, and the voltage regulating unit may determine the ratio of the first resistance and the second resistance based on the data.

During a detection period, the storage regulating unit may modify the data such that the test voltage increases periodically.

The detection period may start based on an enable signal, and may end when the feedback signal indicates that the gate-source voltage is the Dirac voltage.

The enable signal may indicate a start of the detection period based on at least one of a manufacture time, a power on time, and an initialization time of the semiconductor device.

The graphene transistor may be formed in a first region including graphene, and the voltage generator and the detector may be formed in a second region which does not include the graphene.

The semiconductor device may further include a signal converter that is formed in the second region, and receives an input signal from the second region and outputs an output signal obtained by converting the input signal, wherein the output signal is supplied to the first region.

The input signal may include an off voltage and a power voltage, and the signal converter converts the off voltage into the Dirac voltage, and converts the power voltage into an operational voltage of the graphene transistor.

According to another example embodiment, a semiconductor device includes a voltage generator which generates a first test voltage, a graphene transistor which receives a first gate-source voltage based on the first test voltage, and a detector which detects whether the first gate-source voltage is a Dirac voltage of the graphene transistor, and which outputs a first feedback signal to the voltage generator, the first feedback signal indicating that the first gate-source voltage is the Dirac voltage, if the graphene transistor is off.

If the first feedback signal indicates that the first gate-source voltage is not the Dirac voltage, the voltage generator may generate a second test voltage, and the graphene transistor may receive a second gate-source voltage based on the second test voltage, and the detector may detect whether the second gate-source voltage is the Dirac voltage of the graphene transistor, and output a second feedback signal to the voltage generator, the second feedback signal indicating that the second gate-source voltage is the Dirac voltage, if the graphene transistor is off.

According to another example embodiment, a method of operating a semiconductor device including a graphene transistor, includes: generating a test voltage; applying a gate-source voltage to the graphene transistor based on the test voltage; detecting whether the gate-source voltage is a Dirac voltage of the graphene transistor; generating a feedback signal indicating whether the gate-source voltage is the Dirac voltage; and determining whether to modify the test voltage, based on the feedback signal.

The detecting whether the gate-source voltage is a Dirac voltage of the graphene transistor may include: detecting whether the graphene transistor is turned off or not, by applying the gate-source voltage to the graphene transistor; and if the graphene transistor is detected as being turned off, detecting the gate-source voltage as the Dirac voltage.

The test voltage may be generated based on data stored in a storage unit.

The determining whether to modify the test voltage, based on the feedback signal, may include: when the feedback signal indicates that the gate-source voltage is not the Dirac voltage, modifying the data stored in the storage unit; and modifying the test voltage based on the modified data.

The method may further include: converting an input signal received from a second region; and supplying, to a first region, an output signal obtained by converting the input signal, wherein the first region is where the graphene transistor is formed.

The input signal may include an off voltage and a power voltage, and the converting the input signal may include: converting the off voltage into the Dirac voltage; and converting the power voltage into an operational voltage of the graphene transistor.

According to another example embodiment, a semiconductor device includes a graphene transistor having a gate-source voltage that is based on a test voltage, a voltage generator configured to generate the test voltage which varies in response to a feedback signal, and a detector. The detector configured to detect whether the gate-source voltage is a reference voltage; and output the feedback signal to the voltage generator indicating whether the gate-source voltage is the reference voltage. The reference voltage may be a voltage level where a conductivity of the graphene transistor is a minimum.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Example embodiments will now be described more fully with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. It will be understood that, although the terms first, second, etc. may be used herein to describe various elements, these elements should not be limited by these terms. These terms are only used to distinguish one element from another. As used herein, the term "and/or," includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

In the drawings, for example, according to the manufacturing techniques and/or tolerances, shapes of the illustrated elements may be modified. Thus, the embodiments should not be construed as being limited to the embodiments set forth herein, and should include, for example, variations in the shapes caused during manufacture.

Figure 1:
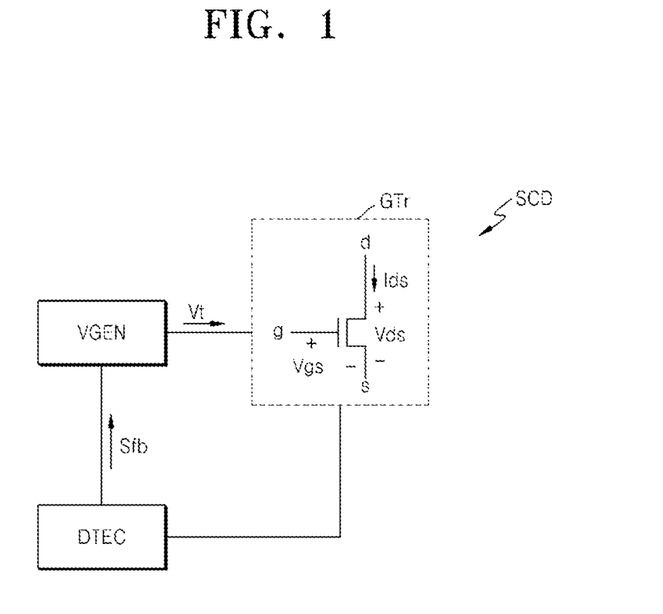
FIG. 1 is a diagram illustrating a semiconductor device according to an example embodiment.
Figure 2:
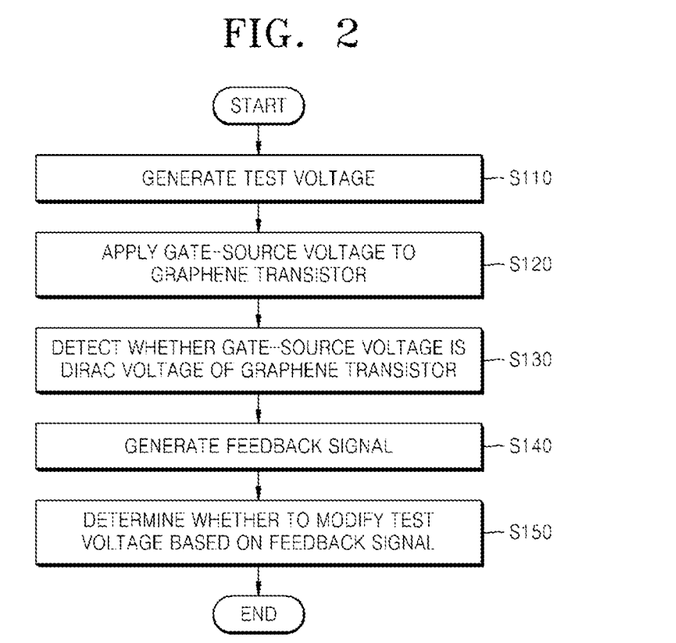
FIG. 2 is a flowchart illustrating a method of illustrating a method operating the semiconductor device of FIG. 1, according to an example embodiment.

FIG. 1 is a diagram illustrating a semiconductor device SCD according to an example embodiment, and FIG. 2 is a flowchart illustrating a method of operating the semiconductor device SCD of FIG. 1 according to an example embodiment.

Referring to FIGS. 1 and 2, the semiconductor device SCD may include a graphene transistor GTr, a voltage generator VGEN, and a detector DTEC.

The graphene transistor GTr is a transistor that uses graphene as a semiconductor. Hereinafter, to distinguish a graphene transistor GTr, transistors using a semiconductor that is not formed of a graphene will be referred to as general transistors. General transistors may usually use silicon as a semiconductor. In this specification, any transistors that are not referred to as graphene transistors are assumed to be general transistors.

Figure 3:
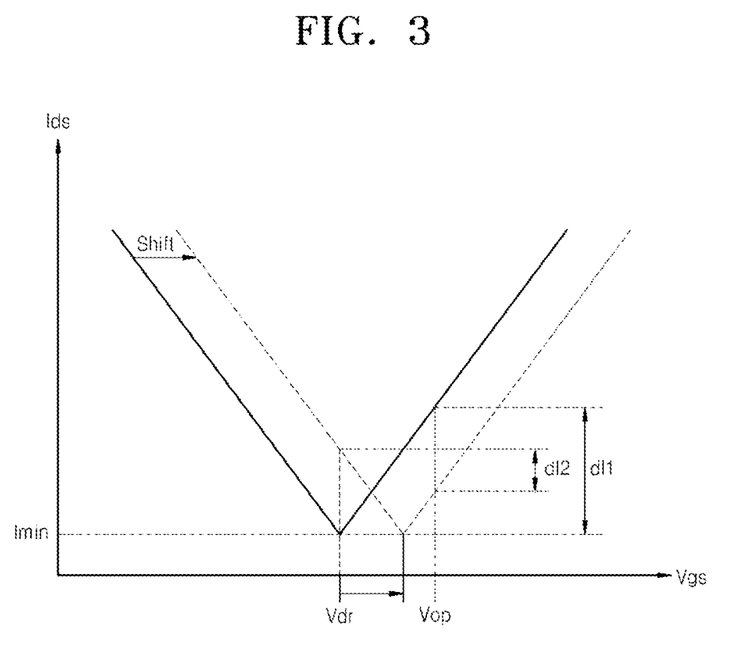
FIG. 3 is a graph showing characteristics of a graphene transistor.

FIG. 3 is a graph showing characteristics of a graphene transistor. An x-axis denotes a gate-source voltage Vgs of the graphene transistor, and a y-axis denotes a drain-source current Ids of the graphene transistor. Here, it is assumed that a drain-source voltage of the graphene transistor is constant.

Referring to FIG. 3, a relationship between the drain-source current Ids and the gate-source voltage Vgs varies with respect to a Dirac voltage Vdr of the graphene transistor.

If the gate-source voltage Vgs is greater than the Dirac voltage Vdr, the drain-source current Ids also increases as the gate-source voltage Vgs increases. If the gate-source voltage Vgs is less than the Dirac voltage Vdr, the drain-source current Ids decreases as the gate-source voltage Vgs increases.

If the gate-source voltage Vgs is identical to the Dirac voltage Vdr, the drain-source current Ids becomes a minimum current Imin. That is, when the gate-source voltage Vgs of the graphene transistor is the Dirac voltage Vdr, the conductivity of the graphene transistor is minimized. Hereinafter, the Dirac voltage Vdr is defined as a gate-source voltage Vgs that minimizes the conductivity of a graphene transistor. The Dirac voltage Vdr corresponds to a Dirac point. Also, when the graphene transistor has the lowest conductivity, the graphene transistor is referred as as being in an off state.

The Dirac voltage Vdr is not always fixed, for example the Dirac voltage Vdr may shift due to charged impurities. A state of the graphene transistor may change if the gate-source voltage Vgs remains constant when there is a shift in the Dirac voltage Vdr. Therefore, it may be desirable to detect the Dirac voltage Vdr.

FIG. 3 is an illustration of an example of a shift in the Dirac voltage Vdr. A current gain of an operational voltage Vop before the Dirac voltage Vdr is shifted is referred to as a first current gain dI1. A current gain of an operational voltage Vop after the Dirac voltage Vdr has shifted is referred to as a second current gain dI2.

When the Dirac voltage Vdr has shifted, a current gain may be reduced, resulting in the second current gain dI2 being less than the first current gain dI1. This reduction in current gain may result in an error in an operation of a graphene transistor, and a leakage current may be generated.

Referring to FIGS. 1 through 3 again, the voltage generator VGEN is configured to generate a test voltage Vt in operation S110. In operation S120, a gate-source voltage Vgs may be applied to the graphene transistor GTr based on the test voltage Vt.

The detector DTEC is configured to detect whether the gate-source voltage Vgs is a Dirac voltage Vdr of the graphene transistor GTr in operation S130. To detect whether the gate-source voltage Vgs is a Dirac voltage Vdr, the detector DTEC may detect whether the graphene transistor GTr is turned off or not. If the graphene transistor GTr is detected as being in an off state, the detector DTEC may detect the gate-source voltage Vgs as a Dirac voltage Vdr. The detector DTEC may detect whether the graphene transistor GTr is turned off or not based on at least one of the group consisting of a drain-source voltage Vds and a drain-source current Ids.

In operation S140, the detector DTEC is configured to output a feedback signal Sfb indicating whether the gate-source voltage Vgs is a Dirac voltage Vdr or not. The feedback signal Sfb may be applied to the voltage generator VGEN.

The voltage generator VGEN is configured to determine whether to modify the test voltage Vt based on the feedback signal Sfb in operation S150. If the feedback signal Sfb indicates that the gate-source voltage Vgs is not a Dirac voltage Vdr, the voltage generator VGEN may modify the test voltage Vt. The voltage generator VGEN may modify the test voltage Vt until a feedback signal Sfb indicating that the gate-source voltage Vgs is the Dirac voltage Vdr is received.

As described above, according to one or more example embodiments, a Dirac voltage Vdr of the graphene transistor GTr may be detected. By detecting a Dirac voltage Vdr, a malfunction of the graphene transistor GTr may be prevented.

Figure 4:
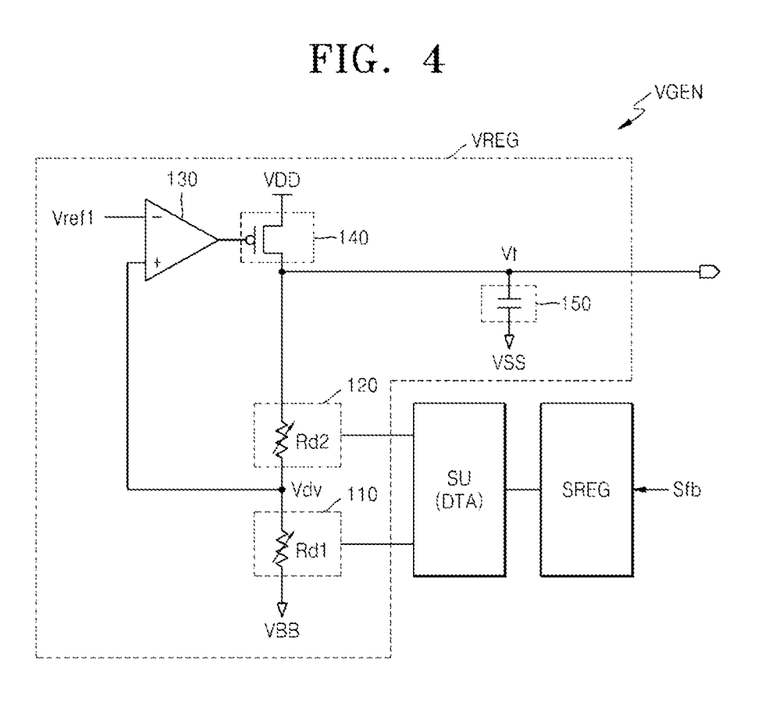
FIG. 4 is a diagram illustrating a voltage generator included in the semiconductor device of FIG. 1, according to an example embodiment.

FIG. 4 is a diagram illustrating a voltage generator VGEN included in the semiconductor device SCD of FIG. 1, according to an example embodiment.

Referring to FIG. 4, the voltage generator VGEN may include a storage unit SU, a storage regulating unit SREG, and a voltage regulating unit VREG.

The voltage regulating unit VREG is configured to generate a test voltage Vt based on data DTA stored in the storage unit SU. The storage regulating unit SREG is configured to control the storage unit SU to regulate the data DTA that is stored in the storage unit. The storage regulating unit SREG may regulate the data DTA based on a feedback signal Sfb.

The voltage regulating unit VREG may include a first variable resistor 110, a second variable resistor 120, an amplifier 130, a transistor 140, and a capacitor 150. The transistor 140 may be a P-type transistor. Resistance of the first variable resistor 110 is referred as a first resistance Rd1, and resistance of the second variable resistor 120 is referred to as a second resistance Rd2.

The first variable resistor 110 and the second variable resistor 120 may be serially connected. A divisional voltage Vdv may be generated between a test voltage Vt and a bias voltage VBB based on a ratio between the first resistance Rd1 and the second resistance Rd2. The bias voltage VBB may be a negative voltage. The divisional voltage Vdv may be determined according to Equation 1, shown below.

$$Vdv=[(Vt-VBB)Rd1/(Rd1+Rd2)]+VBB \qquad \text{[Equation 1]}$$

The amplifier 130 is configured to receive a first reference voltage Vref1 and the divisional voltage Vdv and output an amplification voltage. The amplification voltage may be applied to a gate terminal of the transistor 140.

If the divisional voltage Vdv is less than the first reference voltage Vref1, the amplification voltage is in a low state, thereby turning on the transistor 140. As the transistor 140 is turned on, the capacitor 150 is charged, and the test voltage Vt increases gradually. Therefore, as the test voltage Vt increases gradually, the divisional voltage Vdv also increases gradually according to Equation 1.

As the divisional voltage Vdv gradually increases to be greater than the first reference voltage Vref1, the amplification voltage is in a high state, thereby turning off the transistor 140. As the transistor 140 is turned off, the capacitor 150 is discharged and the test voltage Vt is reduced. Therefore, as the test voltage Vt is reduced, the divisional voltage Vdv also is reduced according to Equation 1.

When the divisional voltage Vdv is reduced to be less than the first reference voltage Vref1, the transistor 140 is turned on again resulting in an increase in the test voltage Vt.

That is, as the transistor 140 is repeatedly turned on and off, the divisional voltage Vdv may converge to the first reference voltage Vref1, and the test voltage Vt may converge to Equation 2 below.

$$Vt=[(Vref1-VBB)(Rd1+Rd2)/Rd1]+VBB \qquad \text{[Equation 2]}$$

A ratio between the first resistance Rd1 and the second resistance Rd2 may be adjusted by the data DTA stored in the storage unit SU, and the data DTA may be regulated by the storage regulating unit SREG. Accordingly, when the data DTA varies, the test voltage Vt may vary according to Equation 2.

Figure 5:
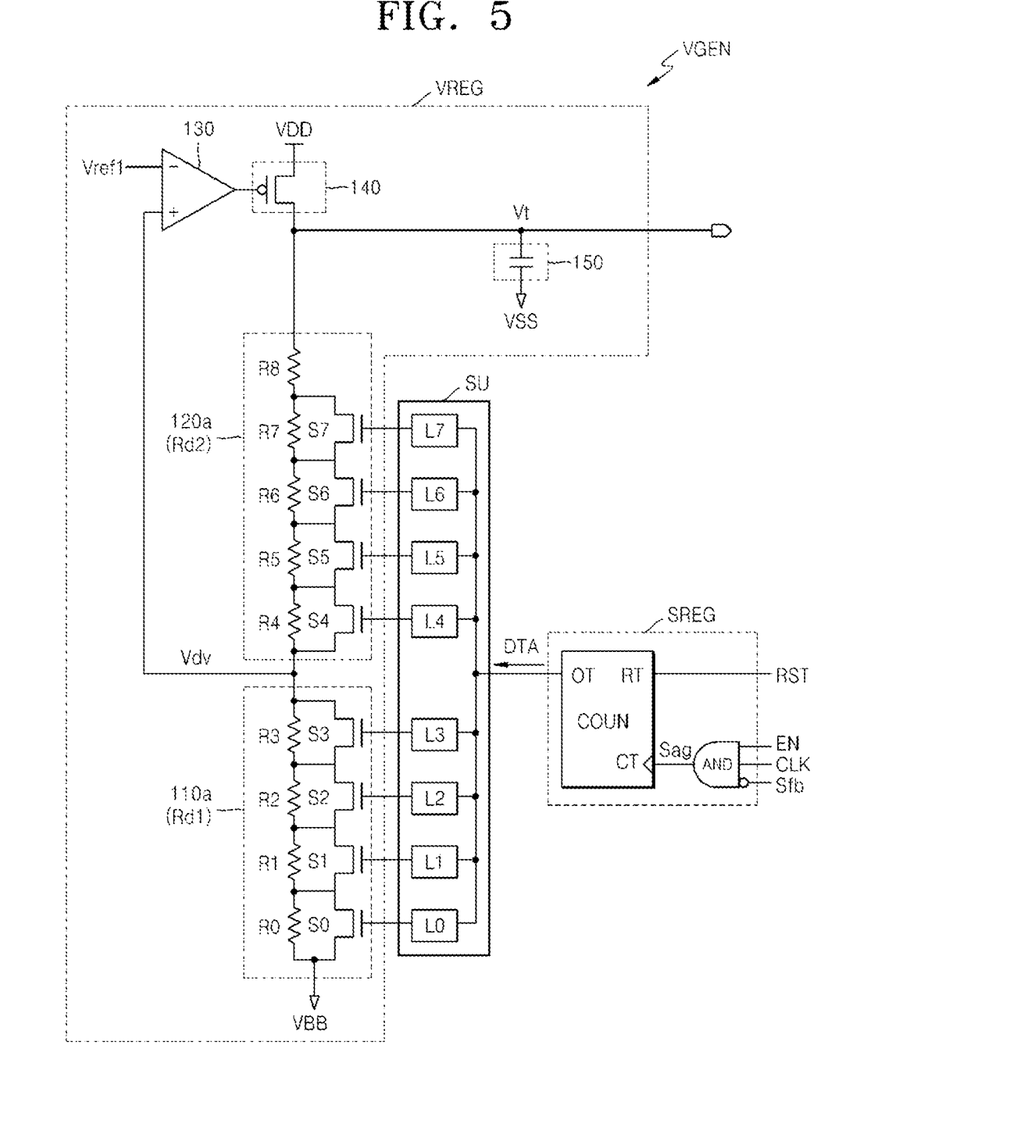
FIG. 5 is a diagram illustrating a voltage generator included in the semiconductor device of FIG. 1, according to another example embodiment.

FIG. 5 is a diagram illustrating a voltage generator included in the semiconductor device SCD of FIG. 1, according to another example embodiment. The voltage generator of FIG. 5 may be a modification of the voltage generator FIG. 4. Accordingly, description of the voltage generator that is already provided with reference to FIG. 4 is omitted.

Referring to FIG. 5, first and second variable resistors 110a and 110b may include a plurality of resistors R0 to R8 and switch transistors S0 to S7. The storage unit SU may include latches L0 to L7. The storage regulating unit SREG may include a counter COUN and an AND gate. FIG. 5 is an illustration of an example embodiment, and the number of resistors, switch transistors, and latches is not limited to the number illustrated in FIG. 5.

A drain terminal and a source terminal of each of the switch transistors S0 to S7 may be connected to two terminals of a corresponding resistor of the plurality of resistors R0 to R7, such that each switch transistor S0 to S7 is connected in parallel with the corresponding resistor of the plurality of resistors R0 to R7. Gate terminals of the switch transistors S0 to S7 may be connected to corresponding latches L0 to L7. Whether each of the switch transistors S0 to S7 is turned on or not may be controlled by a corresponding latch L0 to L7. For example, the switch transistor S2 is connected to two terminals of the resistor R2, and the switch transistor S2 is connected to the latch L2 such that if '1' is stored in the latch L2, the switch transistor S2 is turned on bypassing resistor R2 connected in parallel. Data DTA output from the counter COUN may be stored in the plurality of the latches L0 to L7 of the storage unit SU. For example, if data DTA is 8 bits, data from a least significant bit to a most significant bit of the data DTA may be sequentially stored in the latch L0 to the latch L7, respectively. If the data DTA is '0b1100 1000', it may be stored in the plurality of latches L0 to L7 such that the LSB '0' is stored in the latch L0, and a second bit '0' is stored in the latch L1. If "1100 1000" is stored sequentially from the latch L0 to the latch L7, the transistors S3, S6, and S7 are turned on bypassing the corresponding resistors R3, R6 and R7. Accordingly, a first resistance Rd1 is 'R0+R1+R2', and a second resistance Rd2 is 'R4+R5+R8'. However, the data DTA may be stored in the plurality of latches L0 to L7 in various manners and is not limited to the arrangement in this illustrative example.

The resistors R0 to R8 may have various resistances that are the same or different from one another. Also, the resistances of the resistors R0 to R8 may be set such that "(Rd1+Rd2)/Rd1'" increases as the value of data DTA increases. In this case, as the value of data DTA increases, the test voltage Vt is increased (see Equation 2).

The counter COUN of the storage regulating unit SREG is configured to regulate the value of data DTA. The counter COUN may include a reset terminal RT, a clock terminal CT, and an output terminal OT. The reset terminal RT receives a reset signal RST, and the clock terminal CT receives a gate output signal Sag, which is an output of the AND gate. The output terminal OT may be connected to the storage unit SU and configured to output the data DTA. The output data DTA may be stored in the storage unit SU.

When a reset signal RST is applied to the reset terminal RT, the counter COUN may be initialized.

The AND gate of the storage regulating unit SREG is configured to apply a gate output signal Sag to the clock terminal CT of the counter COUN. The gate output signal Sag may be a signal obtained by performing an AND gate operation on an enable signal EN, a clock signal CLK, and a feedback signal Sfb.

The counter COUN is configured to regulate the value of the data DTA stored in the storage unit SU based on the gate output signal Sag that is applied to the clock terminal CT, and output the regulated data DTA via the output terminal OT.

Figure 6:
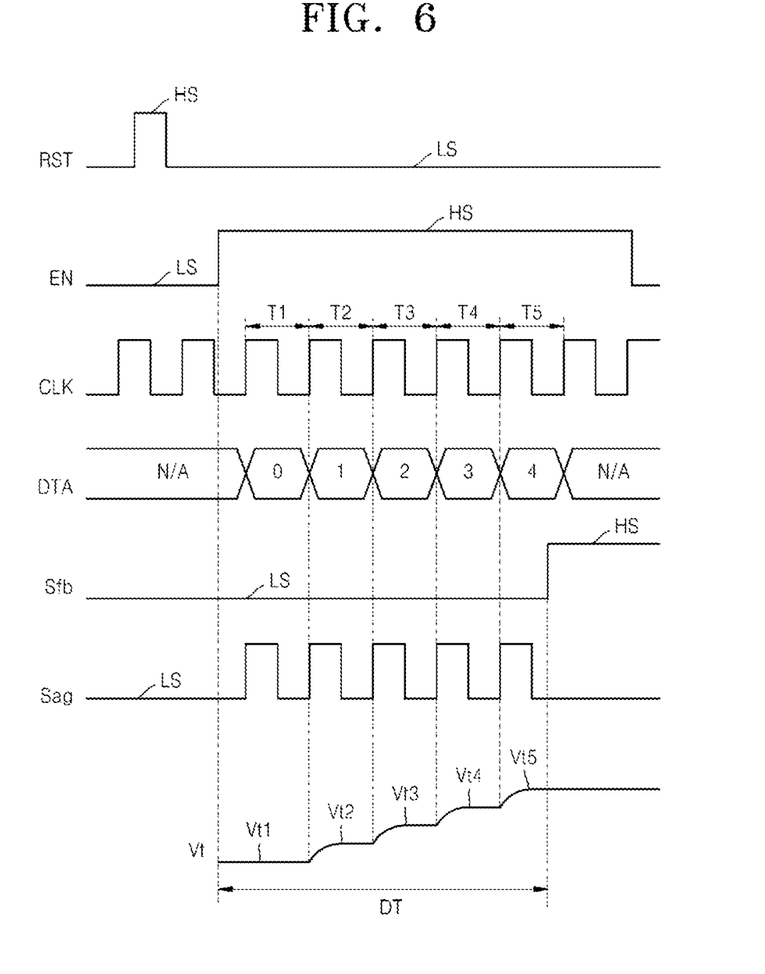
FIG. 6 illustrates a relationship between signals applied to the voltage generator illustrated in FIG. 5 and a test voltage generated by the voltage generator according to an example embodiment.

FIG. 6 illustrates a relationship between signals applied to the voltage generator VGEN illustrated in FIG. 5 and a test voltage Vt according to an example embodiment. However, FIG. 6 is an example for convenience of description, and an operation of the voltage generator VGEN is not limited to the example of FIG. 6.

Referring to FIGS. 5 and 6, a reset signal RST in a high state HS is applied to the counter COUN to initialize the counter COUN. Until an enable signal EN in a high state HS is applied to the AND gate, a gate output signal Sag that is applied to the clock terminal CLK of the counter COUN is in a low state LS, and thus the counter COUN does not operate.

Once the enable signal EN is changed from the low state LS to the high state HS, a detection period DT starts. During the detection period DT, a gate output signal Sag that has the same waveform as a waveform of the clock signal CLK is supplied to the clock terminal CT of the counter COUN. The counter COUN outputs data DTA whose value increases by one in each of a first period T1 through a fifth period T5 of the clock signal CLK in the detection period DT, and the output data DTA is stored in the storage unit SU.

The detection period DT may start in various ways. For example, the detection period DT may start when the semiconductor device SCD (see FIG. 1) is manufactured, powered on, or initialized. For instance, the enable signal EN may command a start of the detection period DT at one or more of the manufacture time, power on time, or initialization time of the semiconductor device SCD.

Alternatively, the detection period DT may start periodically or non-periodically. When the detection period DT starts non-periodically, it may start when a temperature variation detected through a temperature compensation circuit is equal to or greater than a critical value. However, the aforementioned starting conditions of the detection period are examples, and starting conditions of the detection period DT are not limited thereto.

Before the detection period DT starts, the counter COUN is initialized by the reset signal RST and thus the counter COUNT may start counting from 0.

In the first period T1 of the detection period DT, the output terminal OT of the counter COUN outputs 0(=0b0000 0000) as data DTA. The voltage regulating unit VREG of the voltage generator VGEN generates a test voltage Vt based on data DTA, having the value 0 in the first period T1, which is stored in the storage unit SU, and the test voltage Vt settles to a first test voltage Vt1 during the first period T1.

A feedback signal Sfb is maintained in the low state LS during the first period T1, and thus the counter COUN increases the value of data DTA from 0(=0b0000 0000) to 1(=0b0000 0001) in the second period T2. The voltage regulating unit VREG of the voltage generator VGEN generates a test voltage Vt based on the increased data DTA, having the value 1 in the second period T2, and the test voltage Vt settles to a second test voltage Vt2 during the second period T2.

Continuing in this manner, in the fifth period T5, the data DTA is 4(=0b 0000 0100), and a test voltage Vt corresponding to the data DTA is generated, and during the fifth period T5, the test voltage Vt settles to a fifth test voltage Vt5.

During the fifth period T5, the feedback signal Sfb is switched from a low state LS to a high state HS. The switching of the feedback signal Sfb may denote that the detector DTEC (see FIG. 1) has detected a Dirac voltage Vdr (see FIG. 3), as will be described in detail below. When the feedback signal Sfb is changed to the high state HS, the gate output signal Sag is changed to a low state LS, and thus the counter COUN does not operate. Accordingly, in this example, the data DTA stored in the storage unit SU is fixed to 4. The detection period DT that started based on the enable signal EN may expire based on the feedback signal Sfb.

Figure 7:
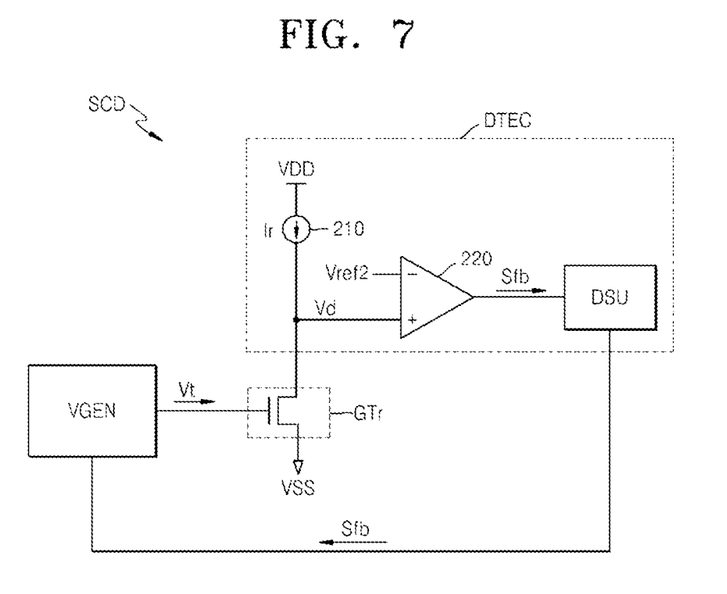
FIG. 7 is a circuit diagram illustrating an example of the semiconductor device of FIG. 1.

FIG. 7 illustrates an example embodiment of the semiconductor device SCD of FIG. 1. In FIG. 7, the detector DTEC of the semiconductor device SCD of FIG. 1 is illustrated in detail. Except the detector DTEC, description of other elements of the semiconductor device SCD of FIG. 1 described above may apply to FIG. 7. Thus, for the sake of brevity repeated descriptions are omitted.

Referring to FIG. 7, the detector DTEC of the semiconductor SCD may include a current source 210 and an amplifier 220. The current source 210 is configured to supply a reference current Ir. The current source 210 and the amplifier 220 may be connected to a drain terminal of a graphene transistor GTr.

The amplifier 220 is configured to receive a detection voltage Vd, which is a voltage of the drain terminal of the graphene transistor GTr, and a second reference voltage Vref2, and output a feedback signal Sfb that may be fed back to the voltage generator VGEN.

When the detection voltage Vd is less than the second reference voltage Vref2, the feedback signal Sfb is in a low state. When the detection voltage Vd is greater than the second reference voltage Vref2, the feedback signal Sfb is triggered from the low state to a high state.

The detector DTEC may further include a detection storage unit DSU, which may store the feedback signal Sfb.

A gate terminal of the graphene transistor GTr is configured to receive a test voltage Vt generated by the voltage generator VGEN. A source terminal of the graphene transistor GTr receives a ground voltage VSS. A drain terminal of the graphene transistor GTr may be connected to the detector DTEC. Accordingly, the detection voltage Vd may be a drain-source voltage of the graphene transistor GTr.

A drain-source current of the graphene transistor GTr is the reference current Ir and thus constant, and accordingly, the detection voltage Vd of the graphene transistor GTr may be determined by the test voltage Vt, which is a gate-source voltage.

The graphene transistor GTr may operate as a resistor that has a resistance that is controlled according to the test voltage Vt, and the detection voltage Vd is determined according to the reference voltage Ir and the resistance.

If the test voltage Vt is a Dirac voltage Vdr (see FIG. 3), the graphene transistor GTr may turn off and thus the graphene transistor GTr will have a relatively lowest conductivity and a greatest resistance. Accordingly, the detection voltage Vd becomes the greatest. For example, the greatest value of the detection voltage Vd may be a power voltage VDD.

The second reference voltage Vref2 may be set such that the greatest detection voltage Vd is detected. For example, when the second reference voltage Vref2 is set to have a slightly lower value than the greatest drain voltage, the graphene transistor GTr is turned off and the detection voltage Vd becomes the greatest, and a feedback signal Sfb is triggered from a low state to a high state, accordingly. The test voltage Vt that triggers the feedback signal Sfb may be detected as a Dirac voltage Vdr.

Referring to the example shown in FIG. 6 again, when the test voltage Vt is a fifth test voltage Vt5, the feedback signal Sfb switches from a low state LS to a high state HS. Accordingly, the fifth test voltage Vt5 may be detected as a Dirac voltage Vdr.

Figure 8:
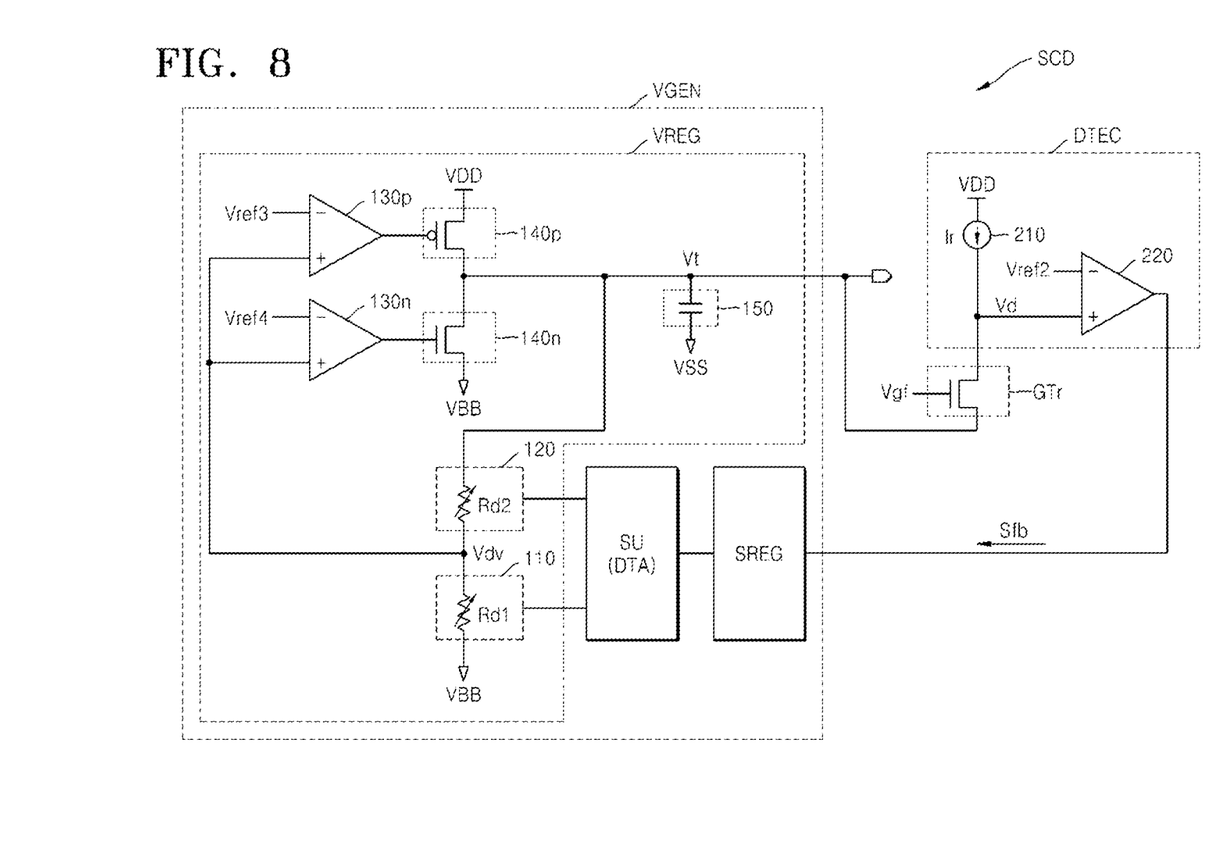
FIG. 8 is a circuit diagram illustrating another example of the semiconductor device of FIG. 1.

FIG. 8 illustrates another example embodiment of the semiconductor device SCD of FIG. 1.

Referring to FIG. 8, a gate terminal of a graphene transistor GTr is configured to receive a fixed gate voltage Vgf. A source terminal of the graphene transistor GTr is configured to receive a test voltage Vt generated by a voltage generator VGEN. A drain terminal of the graphene transistor GTr may be connected to a detector DTEC.

A structure of the detector DTEC of FIG. 8 is substantially the same as the structure of the detector DTEC illustrated in FIG. 7. Accordingly, the description of the detector DTEC of FIG. 7 may apply to the detector DTEC of FIG. 8.

However, the gate terminal of the graphene transistor GTr in FIG. 7 receives a test voltage Vt, and a source terminal thereof receives a ground voltage VSS. That is, a gate-source voltage of the graphene transistor GTr in FIG. 7 is a test voltage Vt, and a gate-source voltage of the graphene transistor GTr in FIG. 8 is a difference between the fixed gate voltage Vgf and the test voltage Vt. Also, while the detection voltage Vd in FIG. 7 is a drain-source voltage of the graphene transistor GTr, the detection voltage Vd in FIG. 8 is a sum of the test voltage Vt and the drain-source voltage of the graphene transistor GTr.

Although terminals to which the test voltage Vt is applied and the detection voltage Vd may differ in the embodiments of both FIGS. 7 and 8, a gate-source voltage is applied to the graphene transistor GTr based on the test voltage Vt in both of the semiconductor devices SCD of FIGS. 7 and 8, and thus in both example embodiments a Dirac voltage Vdr of the graphene transistor GTr may be detected.

The voltage generator VGEN may include a storage unit SU, a storage regulating unit SREG, and a voltage regulating unit VREG. The description of the storage unit SU and the storage regulating unit SREG of FIGS. 4 through 6 may also apply to those in FIGS. 7 and 8. Thus, for the sake of brevity repeated descriptions are omitted.

The voltage regulating unit VREG of FIG. 8 may include a first variable resistor 110, a second variable resistor 120, amplifiers 130$p$ and 130$n$, transistors 140$p$ and 140$n$, and a capacitor 150. The structure of the voltage regulating unit VREG of FIG. 8 is similar to that of the voltage regulating unit VREG of FIGS. 4 and 5 except for the amplifiers 130$p$ and 130$n$ and the transistors 140$p$ and 140$n$. The transistor 140$p$ may be a P-type transistor, and the transistor 140$n$ may be an N-type transistor.

An output of the amplifier 130$p$ is applied to a gate terminal of the transistor 140$p$. The transistor 140$p$ is configured to turn on when a divisional voltage Vdv of the transistor 140$p$ is less than a third reference voltage Vref3, and turn off when the divisional voltage Vdv thereof is greater than the third reference voltage Vref3.

An output of the amplifier 130$n$ may be applied to a gate terminal of the transistor 140$n$. The transistor 140$n$ is configured to turn on when a divisional voltage Vdv of the transistor 140$n$ is greater than a fourth reference voltage Vref4, and is turn off when the divisional voltage Vdv thereof is less than the fourth reference voltage Vref4.

If the divisional voltage Vdv is less than the third reference voltage Vref3, and also less than the fourth reference voltage Vref4, in an initial stage when a test voltage Vt is generated, only the first transistor 140$p$ may turn on to generate a positive test voltage Vt.

If an initial divisional voltage Vdv is greater than the third reference voltage Vref3, and is also greater than the fourth reference voltage Vref4, only the transistor 140$n$ may turn on to generate a negative test voltage Vt.

A divisional voltage Vdv at an initial stage may be determined based on a ratio of a first resistance Rd1 and a second resistance Rd2 between a ground voltage VSS and a bias voltage VBB. Various voltages from a negative voltage to a positive voltage may be generated as a test voltage Vt based on various ratios of the first resistance Rd1 and the second resistance Rd2.

Figure 9:
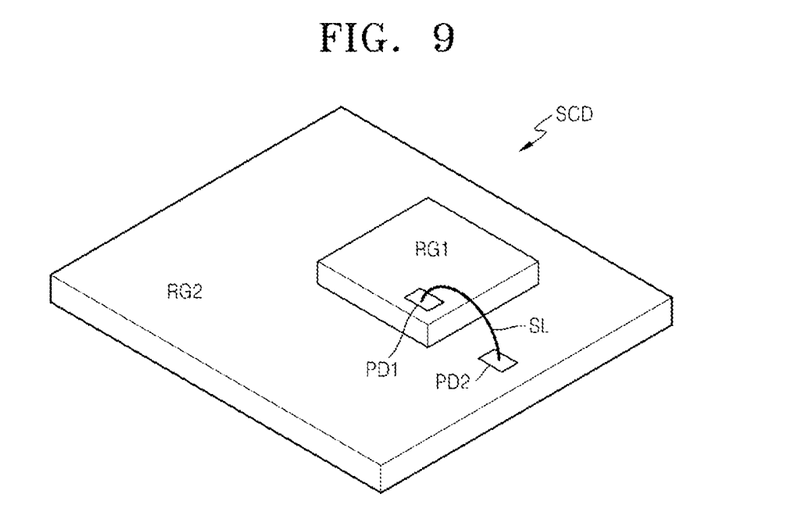
FIG. 9 is a schematic perspective view illustrating a semiconductor device according to another example embodiment.

FIG. 9 is a schematic perspective view illustrating a semiconductor device SCD according to another example embodiment.

Referring to FIG. 9, the semiconductor device SCD may include a first region RG1 and a second region RG2. The first region RG1 may include graphene, and the second region RG2 may not include graphene. A graphene transistor GTr (see FIG. 1) may be formed in the first region RG1. A voltage generator VGEN (see FIG. 1) and a detector DTEC (see FIG. 1) may be formed in the second region RG2. The second region RG2 may include silicon (Si) instead of graphene. A transistor, for example, a transistor 140 (see FIG. 4) may be formed in the second region RG2, and may be a general transistor and not a graphene transistor.

The first region RG1 may include a first pad PD1, and the second region RG2 may include a second pad PD2. The first pad PD1 of the first region RG1 and the second pad PD2 of the second region RG2 may be connected via a signal line SL. Each region shown in FIG. 9 includes a single pad, however, FIG. 9 is an example for convenience of description and each region may include a plurality of pads, and signals may be transmitted or received from or to the first region RG1 and the second region RG2 via the plurality of pads.

Figure 10:
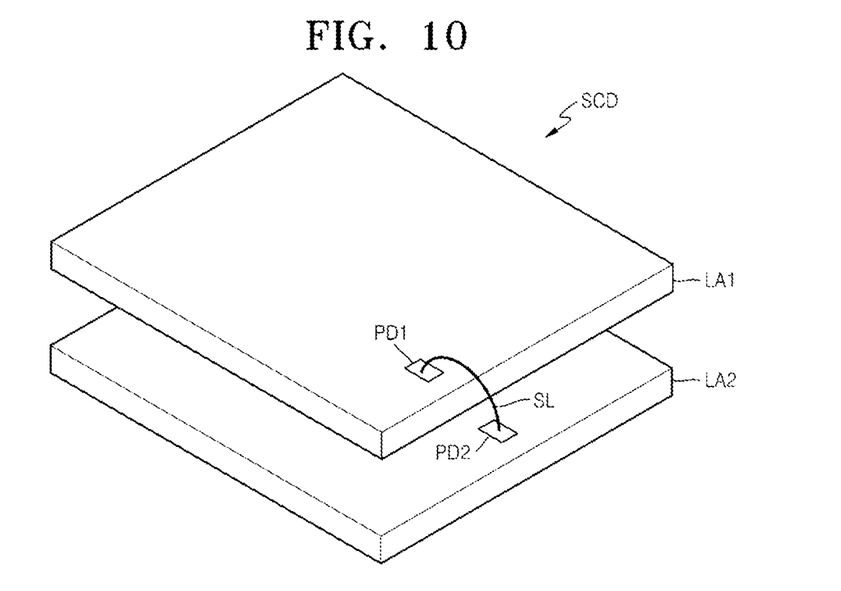
FIG. 10 is a schematic perspective view illustrating a semiconductor device according to another example embodiment.

FIG. 10 is a schematic perspective view illustrating a semiconductor device SCD according to another example embodiment.

Referring to FIG. 10, the semiconductor device SCD may include a first layer LA1 and a second layer LA2. The first layer LA1 may include graphene, and the second layer LA2 may not include graphene. A graphene transistor GTr (see FIG. 1) may be formed in the first layer LA1. A voltage generator VGEN (see FIG. 1) and a detector DTEC (see FIG. 1) may be formed in the second layer LA2. The second layer LA2 may include silicon (Si) instead of graphene. A transistor, for example, a transistor 140 (see FIG. 4) may be formed in the second layer LA2, and may be a general transistor and not a graphene transistor.

The first layer LA1 may include a first pad PD1, and the second layer LA2 may include a second pad PD2. The first pad PD1 of the first layer LA1 and the second pad PD2 of the second layer LA2 may be connected via a signal line SL. Each layer illustrated in FIG. 10 includes a single pad, however, FIG. 10 is an example for convenience of description and each layer may also include a plurality of pads, and signals may be transmitted or received from or to the first layer LA1 and the second layer LA2 via the plurality of pads.

While signals are transmitted or received via the first layer LA1 and the second layer LA2 using the pads PD1 and PD2, signals may also be transmitted or received via the first layer LA1 and the second layer LA2 via a contact, as well-known in the art.

As illustrated in FIGS. 9 and 10, the first region RG1 or the first layer LA1 in which a graphene transistor is formed and the second region RG2 or the second layer LA2 in which a general transistor not using graphene is formed may be physically separated from each other.

Figure 11:
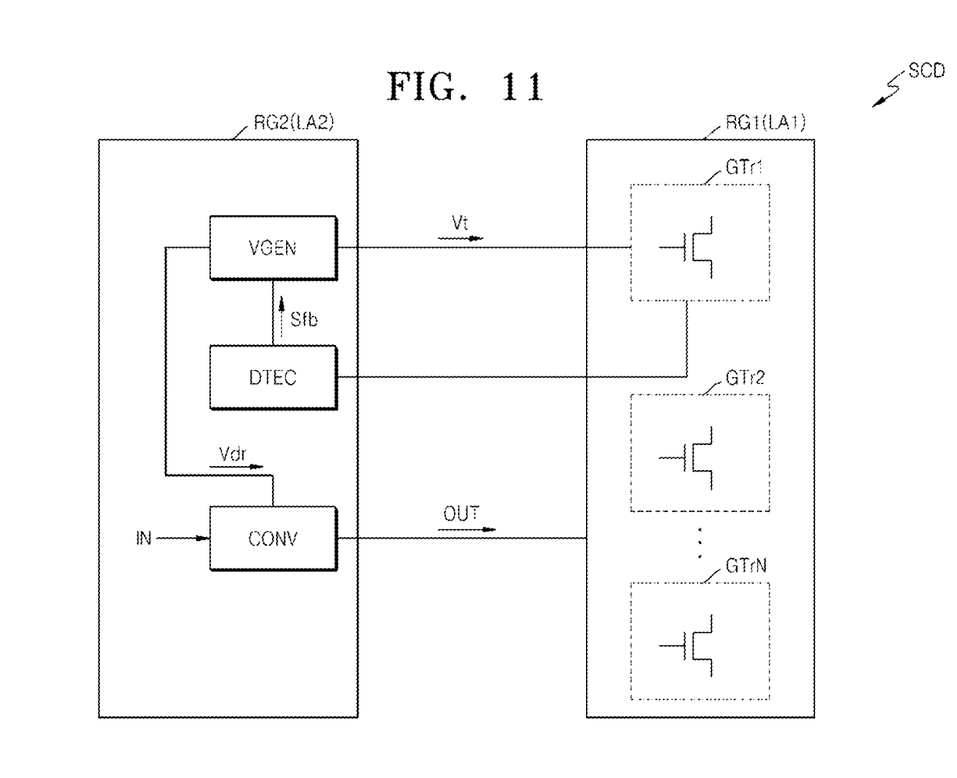
FIG. 11 is a diagram illustrating a semiconductor device according to another example embodiment.

FIG. 11 is a diagram illustrating a semiconductor device SCD according to another example embodiment.

Referring to FIG. 11, the semiconductor device SCD includes a first region RG1 and a second region RG2 (see FIG. 9). Alternatively, the semiconductor device SCD may include a first layer LA1 and a second layer LA2 that are vertically stacked on each other as illustrated in FIG. 10.

A plurality of graphene transistors GTr1 through GTrN may be formed in the first region RG1. A voltage generator VGEN, a detector DTEC, and a signal converter CONV may be formed in the second region RG2.

The semiconductor device SCD is configured to detect a Dirac voltage Vdr of the first graphene transistor GTr1 using the voltage generator VGEN and the detector DTEC. To detect the Dirac voltage Vdr, the graphene transistor GTr1, which may be one of the plurality of the graphene transistors GTr1 through GTrN, may be used. The Dirac voltage Vdr detected by using the graphene transistor GTr1 may be assumed to be a common Dirac voltage Vdr for the plurality of the graphene transistors GTr1 through GTrN.

Alternatively, a Dirac voltage may be detected from each of the plurality of the graphene transistors GTr1 through GTrN. Alternatively, the plurality of the graphene transistors GTr1 through GTrN may be divided into groups of adjacent graphene transistors. A Dirac voltage Vdr of one graphene transistor may be detected from each group, and this may be used as a common Dirac voltage for the corresponding group. The method of detecting the Dirac voltage Vdr has been described above and for the sake of brevity repeated descriptions are omitted.

The Dirac voltage Vdr that turns off the graphene transistor GTr and an off voltage that turns off a general transistor may be different. Also, an operational voltage driving the graphene transistor GTr and a power voltage for driving a general transistor may be different. Accordingly, when a signal is transmitted or received between the first region RG1 and the second region RG2, a leakage current may be generated due to a difference in the Dirac voltage Vdr and the off voltage and a difference between the operating voltage and the power voltage.

In order to prevent this, the signal converter CONV may convert a signal of the general transistor into a signal of the graphene transistor GTr. The signal converter may receive an input signal IN from the second region RG2 and output an output signal OUT obtained by converting the input signal IN. The output signal OUT may be supplied to the first region RG1.

Figure 12:
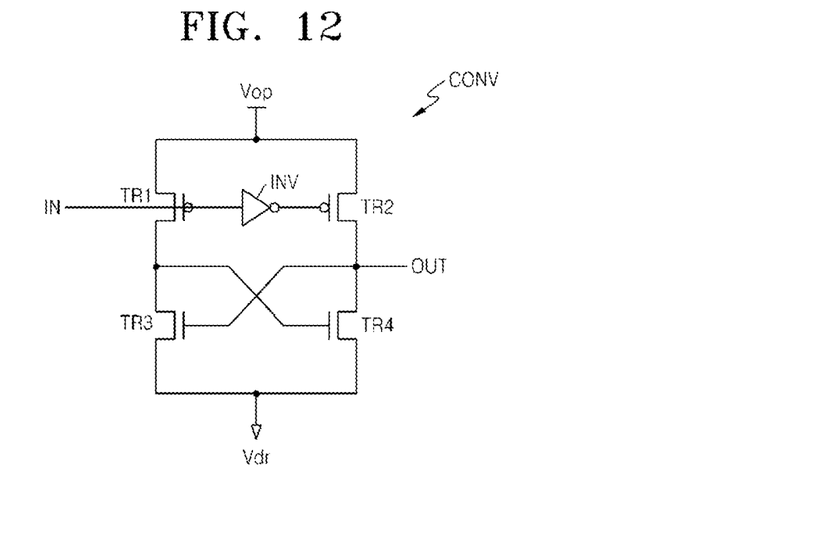
FIG. 12 illustrates a signal converter of FIG. 11 according to an example embodiment.
Figure 13:
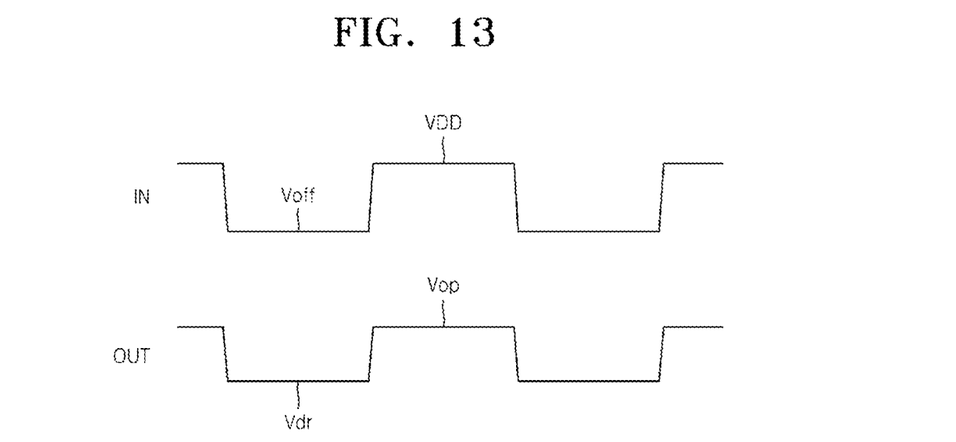
FIG. 13 illustrates a relationship between an input signal and an output signal of the signal converter illustrated in FIG. 12 according to an example embodiment.

FIG. 12 illustrates the signal converter CONV of FIG. 11 according to an example embodiment, and FIG. 13 illustrates an example of a relationship between an input signal IN and an output signal OUT of the signal converter CONV illustrated in FIG. 12.

Referring to FIGS. 11 through 13, the signal converter CONV may convert an off voltage Voff (e.g., 0 V) of a general transistor into a Dirac voltage Vdr, or a power voltage VDD of a general transistor to an operational voltage Vop of a graphene transistor GTr.

The signal converter CONV may include a plurality of transistors TR1 through TR4 and an inverter INV. The transistors TR1 and TR2 may be P-type transistors, and the transistors TR3 and TR4 may be N-type transistors.

The transistor TR1 may include a source terminal configured to receive an operational voltage Vop, a gate terminal configured to receive an input signal IN, and a drain terminal that may be connected to a drain terminal of the transistor TR3 and a gate terminal of the transistor TR4.

The transistor TR2 may include a source terminal configured to receive an operational voltage Vop, a gate terminal configured to receive an inverted input signal IV through an inverter INV, and a drain terminal that may be connected to a drain terminal of the transistor TR4 and a gate terminal of the transistor TR3.

Source terminals of the third and fourth transistor TR3 and TR4 may receive a Dirac voltage Vdr. The Dirac voltage Vdr may be supplied from a voltage generator VGEN.

An output terminal of the signal converter CONV may be connected to the drain terminal of the transistor TR2, the gate terminal of the transistor TR3, and the drain terminal of the transistor TR4.

If the input signal IN is an off voltage Voff of a general transistor, the transistor TR1 is turned on, and the transistor TR4 is turned on because the gate terminal of the transistor TR4 has received the operational voltage Vop. Accordingly, an output signal OUT is a Dirac voltage Vdr. Here, the transistor TR2 is turned off due to the inverted input signal IN, and the transistor TR3 is turned off because the gate terminal of the transistor TR3 has received the Dirac voltage Vdr.

When the input signal IN is a power voltage VDD, the transistors TR2 and TR3 are turned on, and the transistors TR1 and TR4 are turned off. Accordingly, the output signal OUT of the signal converter CONV is an operational voltage Vop.

As described above, the signal converter CONV is configured to convert an off voltage Voff of a general transistor into a Dirac voltage Vdr of a graphene transistor GTr, and convert a power voltage VDD of a general transistor to an operational voltage Vop of a graphene transistor GTr. The signal converter CONV may output an output signal OUT to the first region RG1, and the graphene transistor GTr of the first region RG1 may be driven via the Dirac voltage Vdr and the operational voltage Vop.

As described above, according to the one or more of the above example embodiments, a semiconductor device including a graphene transistor and a method of efficiently operating the semiconductor device including a graphene transistor may be provided.

According to the one or more of the above example embodiments, a Dirac voltage of a graphene transistor may be detected. By detecting a Dirac voltage, a malfunction of the graphene transistor may be prevented.

In addition, by using the detected Dirac voltage to operate the graphene transistor, generation of leakage current may be reduced.

The example embodiments have been described with reference to the drawings and the specification. The terms used herein are for illustrative purpose of the embodiments only and should not be construed to limit the meaning or the scope of the embodiments as described in the claims. Thus, it will be understood by those skilled in the art that various changes in form and details may be made therein without departing from the spirit and scope of the embodiments of invention as defined by the appended claims. Therefore, the scope of the embodiments is defined not by the detailed description of the invention but by the appended claims, and all differences within the scope will be construed as being included in the embodiments.

What is claimed is:

1. A semiconductor device comprising:
a voltage generator configured to generate a test voltage;
a graphene transistor configured to receive a gate-source voltage in response to the test voltage; and
a detector configured to detect whether the gate-source voltage is a Dirac voltage of the graphene transistor, and output a feedback signal applied to the voltage generator indicating whether the gate-source voltage is the Dirac voltage.

2. The semiconductor device of claim 1, wherein the detector is configured to detect whether the graphene transistor is off, and if the graphene transistor is detected as being off, the detector detects the gate-source voltage as the Dirac voltage.

3. The semiconductor device of claim 2, wherein the detector is configured to detect whether the graphene transistor is off based on at least one of a drain-source voltage and a drain-source current of the graphene transistor.

4. The semiconductor device of claim 3, wherein if the feedback signal indicates that the gate-source voltage is not the Dirac voltage, the voltage generator is configured to modify the test voltage.

5. The semiconductor device of claim 4, wherein the voltage generator comprises:
a voltage regulating unit configured to generate the test voltage based on data stored in a storage unit; and
a storage regulating unit configured to regulate the data stored in the storage unit based on the feedback signal.

6. The semiconductor device of claim 5, wherein
the voltage regulating unit comprises a first variable resistor and a second variable resistor, and is configured to generate the test voltage based on a ratio of a first resistance of the first variable resistor and a second resistance of the second variable resistor, and
the voltage regulating unit is configured to determine the ratio of the first resistance and the second resistance based on the data.

7. The semiconductor device of claim 6, wherein during a detection period, the storage regulating unit is configured to modify the data such that the test voltage increases periodically.

8. The semiconductor device of claim 7, wherein the detection period starts based on an enable signal and ends when the feedback signal indicates that the gate-source voltage is the Dirac voltage.

9. The semiconductor device of claim 8, wherein the enable signal indicates a start of the detection period based on at least one of a manufacture time, a power on time, and an initialization time of the semiconductor device.

10. The semiconductor device of claim 1, wherein the graphene transistor is formed in a first region including graphene, and the voltage generator and the detector are formed in a second region which does not include the graphene.

11. The semiconductor device of claim 10, further comprising:
a signal converter that is formed in the second region, the signal converter configured to receive an input signal from the second region and output an output signal obtained by converting the input signal,
wherein the output signal is supplied to the first region.

12. The semiconductor device of claim 11, wherein the input signal comprises an off voltage and a power voltage, and
the signal converter is configured to convert the off voltage into the Dirac voltage, and convert the power voltage into an operational voltage of the graphene transistor.

13. A semiconductor device comprising:
a voltage generator configured to generate a first test voltage;
a graphene transistor configured to receive a first gate-source voltage in response to the first test voltage; and
a detector configured to detect whether the first gate-source voltage is a Dirac voltage of the graphene transistor, and output a first feedback signal to the voltage generator, the first feedback signal indicating that the first gate-source voltage is the Dirac voltage, if the graphene transistor is off.

14. The semiconductor device of claim 13, wherein when the first feedback signal indicates that the first gate-source voltage is not the Dirac voltage, the voltage generator is configured to generate a second test voltage, and the graphene transistor is configured to receive a second gate-source voltage based on the second test voltage, and the detector is configured to detect whether the second gate-source voltage is the Dirac voltage of the graphene transistor, and output a second feedback signal to the voltage generator, the second feedback signal indicating that the second gate-source voltage is the Dirac voltage, if the graphene transistor is off.

15. A method of operating a semiconductor device including a graphene transistor, the method comprising:

generating a test voltage;

applying a gate-source voltage to the graphene transistor in response to the test voltage;

detecting whether the gate-source voltage is a Dirac voltage of the graphene transistor;

generating a feedback signal indicating whether the gate-source voltage is the Dirac voltage; and determining whether to modify the test voltage, based on the feedback signal.

16. The method of claim 15, wherein the detecting whether the gate-source voltage is a Dirac voltage of the graphene transistor comprises:

detecting whether the graphene transistor is turned off or not, by applying the gate-source voltage to the graphene transistor; and if the graphene transistor is detected as being turned off, detecting the gate-source voltage as the Dirac voltage.

17. The method of claim 16, wherein the test voltage is generated based on data stored in a storage unit.

18. The method of claim 17, wherein the determining whether to modify the test voltage based on the feedback signal, comprises:

when the feedback signal indicates that the gate-source voltage is not the Dirac voltage, modifying the data stored in the storage unit; and modifying the test voltage based on the modified data.

19. The method of claim 15, further comprising:

converting an input signal received from a second region; and supplying, to a first region, an output signal obtained by converting the input signal, wherein the first region is where the graphene transistor is formed.

20. The method of claim 19, wherein the input signal comprises an off voltage and a power voltage, and the converting the input signal comprises:

converting the off voltage into the Dirac voltage; and converting the power voltage into an operational voltage of the graphene transistor.

21. A semiconductor device comprising:

a graphene transistor having a gate-source voltage that is set in response to a test voltage;

a voltage generator configured to generate the test voltage which varies in response to a feedback signal; and a detector configured to, detect whether the gate-source voltage is a reference voltage; and output the feedback signal to the voltage generator indicating whether the gate-source voltage is the reference voltage.

22. The semiconductor device of claim 21, wherein the reference voltage is a voltage level where a conductivity of the graphene transistor is a minimum.

23. The semiconductor device of claim 21, wherein the voltage generator is further configured to vary the generated test voltage, if the feedback signal indicates that the gate-source voltage is not the reference voltage.

24. The semiconductor device of claim 21, wherein the gate-source voltage is one of the test voltage and a difference between a fixed gate voltage and the test voltage.

25. The semiconductor device of claim 21, wherein the voltage generator comprises a voltage regulating unit configured to generate the test voltage based on the feedback signal.

26. The semiconductor device of claim 25, wherein the voltage regulating unit comprises:

an operational amplifier that is configured to compare a data voltage with a first reference voltage; and a plurality of resistors configured to generate a variable resistance according to the feedback signal such that the data voltage supplied to the operational amplifier varies.

* * * * *